United States Patent
Moisiadis et al.

(10) Patent No.: US 9,672,318 B2
(45) Date of Patent: Jun. 6, 2017

(54) SYNTHESIS OF REDUCED NETLIST HAVING POSITIVE ELEMENTS AND NO CONTROLLED SOURCES

(71) Applicant: Helic, Inc., Santa Clara, CA (US)

(72) Inventors: Yiannis Moisiadis, Athens (GR); Nikolaos Mouravliansky, Athens (GR)

(73) Assignee: HELIC, INC., Santa Clara, CA (US)

( * ) Notice: Subject to any disclaimer, the term of this patent is extended or adjusted under 35 U.S.C. 154(b) by 10 days.

(21) Appl. No.: 14/754,464

(22) Filed: Jun. 29, 2015

(65) Prior Publication Data
US 2016/0378905 A1    Dec. 29, 2016

(51) Int. Cl.
*G06F 17/50* (2006.01)

(52) U.S. Cl.
CPC ........ *G06F 17/5081* (2013.01); *G06F 17/505* (2013.01); *G06F 17/5045* (2013.01)

(58) Field of Classification Search
CPC ........................... G06F 17/5045; G06F 17/505
USPC .................................................. 716/103–104
See application file for complete search history.

(56) References Cited

U.S. PATENT DOCUMENTS

2007/0255538 A1* 11/2007 Chu ..................... G06F 17/5036
   703/2
2014/0280251 A1* 9/2014 Somekh ............ G06F 17/30867
   707/754
2014/0310281 A1* 10/2014 Somekh ............ G06F 17/30312
   707/737

OTHER PUBLICATIONS

Yagle, Andrew E., "Regularized Matrix Computations", 2005, Department of EECS, The University of Michigan, Ann Arbor, MI 48109-2122, pp. 1-7.*
University of Michigan, "2005 Preprints of Andrew E. Yagle," obtained on Sep. 13, 2016 at http://web.eecs.umich.edu/~aey/recent.html. p. 1.*
Ionutiu, Roxana, "Model Order Reduction for Multi-Terminal Systems with Applications to Circuit Simulation", 2001, Eindhoven University of Technology Library, pp. 1-195.*

* cited by examiner

*Primary Examiner* — Stacy Whitmore
(74) *Attorney, Agent, or Firm* — Nixon Peabody, LLP; Khaled Shami (57) ABSTRACT

In one embodiment, a circuit analysis method includes obtaining a netlist of a circuit, generating a reduced model from the netlist, using the reduced model to synthesize a positive netlist having no controlled current or voltage sources, unstamping the synthesized positive netlist, and simulating the circuit using the unstamped synthesized positive netlist.

26 Claims, 4 Drawing Sheets

SYNTHESIS OF REDUCED NETLIST HAVING POSITIVE ELEMENTS AND NO CONTROLLED SOURCES

TECHNICAL FIELD

The present disclosure relates generally to software tools for designing and modeling electronic systems, such as printed circuit boards and integrated circuits.

BACKGROUND

A variety of specialized software tools have been developed to meet the challenges of designing and manufacturing more complex and higher performance electronic systems such as printed circuit boards and integrated circuits (ICs). Layout verification software, such as layout-vs-schematic (LVS) and design rule check (DRC), is used to ensure that the layout connectivity of the physical design of a chip matches the logical design of the chip represented by a schematic and to verify that a design of an IC chip conforms to certain manufacturing tolerances that are required in fabricating the chip. Parasitic extraction generates an equivalent model of the integrated circuit, modeling and extracting the parasitic resistance, inductance and capacitance of the chip. These tools exist in one or more areas commonly referred to as electronic design automation (EDA), electronic computer aided design (ECAD), and technology computer aided design (TCAD). A single EDA platform can offer software modules for integrated circuit layout design, behavioral simulation, and functional analysis and verification.

Several tools and methodologies have been developed based on equivalent circuit extraction to allow for fast and accurate modeling of the interconnection network belonging to a semiconductor layout. In such methodologies, the interconnect structures of the integrated circuit are divided into smaller sections, and each section is modeled by an equivalent circuit that models its electromagnetic behavior, including electrical behavior, along with any parasitic couplings to the substrate or other nearby structures. LPE (layout parasitic extraction) methodologies can be fast and efficient, and their output is usually a circuit netlist comprising R (resistor) and C (capacitor) lumped elements. Some methods are also capable of separately producing L (inductance) and K (mutual inductance) elements which, besides resistor and capacitor elements, are oftentimes required to accurately model the electromagnetic (EM) behavior of an IC at higher frequencies.

A netlist provides a description of the elements connected between the nodes of a circuit, and can contain a very large amount of information that may consequently be difficult to process, analyze and manipulate. Model-order reduction is an important technique to accelerate the simulation of netlists with large size (>1M of elements) and many ports (>10). Among many model-order reduction algorithms, those based on projection methods provide both increased accuracy and optimal performance. The majority of model-order reduction algorithms that fall in this category commonly rely on the Krylov subspace projection method, as implemented in PRIMA method (see Odabasioglu, M. Celik, and L. T. Pileggi, "PRIMA: passive reduced-order interconnect macromodeling algorithm", IEEE Trans. on CAD of Integrated Circuits and Systems, 17(8):645-654, 1998) using the Arnoldi process and the input-output structure-preserving model order reduction methodology. (See Yang, X. Zeng, Y. Su, and D. Zhou, "RLC equivalent circuit synthesis method for structure-preserved reduced order model of interconnects in VLSI", Communication in Computational Physics, 3(2):376-396, 2008).

The input-output structure-preserving model-order reduction methodology as described in Yang can be considered an extension of the SPRIM method (see R. W. Freund. "Sprim: structure-preserving reduced-order interconnect macromodeling," Computer Aided Design, 2004, ICCAD-2004. IEEE/ACM International Conference on, pages 80-87, November 2004. See also U.S. Pat. No. 7,228,259 to Freund).

To understand model-order reduction, a review of the algorithms underlying circuit representation in a netlist is useful. These algorithms rely on modified nodal analysis (MNA) formulations underpinned by Kirchhoff's current and voltage laws, which can be expressed through a directional graph. The edges of the graph correspond to the circuit elements, while the nodes of the graph correspond to the nodes of the circuit, denoting the interconnections of the circuit elements. An arbitrary direction is assigned to graph edges, so that one can distinguish between the source and destination nodes. The directional graph can be described by its incidence matrix A, which is formed as follows: Each row of A corresponds to a graph edge and, therefore, to a circuit element. Each column of A corresponds to a graph or circuit node. Each edge e is formed from an ordered pair of nodes $n_1$ and $n_2$, where the direction of e is from $n_1$ to $n_2$. The column corresponding to the ground node of the circuit is deleted in order to remove redundancy. For a row which is associated with the edge e, the column position which corresponds to the source node $n_1$ contains the entry "1", while the column position which corresponds to the destination $n_2$ contains the entry "−1". For all the other cases the entries are "0".

Kirchhoff's current and voltage laws can be expressed using matrix A:

$$A^T i_b = 0 \qquad \text{Eq. 1}$$

$$A v_n = v_b \qquad \text{Eq. 2}$$

where $i_b$ is the vector of the currents through the circuit elements, $v_b$ is the vector of the voltages across the circuit elements, and $v_n$ is the vector of the voltages at the nodes of the circuit (the non-datum voltages). For the ground node the voltage is assumed zero.

In the most general case of analyzing RLCk circuits, we assume that the circuit is excited by voltage and current sources. In this case, the matrix A and the vectors $i_b$ and $v_b$ can be partitioned according to circuit-element types:

$$A = \begin{pmatrix} A_v \\ A_i \\ A_g \\ A_c \\ A_l \end{pmatrix} \quad i_b = \begin{pmatrix} i_v \\ i_i \\ i_g \\ i_c \\ i_l \end{pmatrix} \quad v_b = \begin{pmatrix} v_v \\ v_i \\ v_g \\ v_c \\ v_i \end{pmatrix} \qquad \text{Eq. 3}$$

where the subscripts g, c, l refer to branches with resistors, capacitors and inductors respectively and the subscripts v, i denote the voltage and current sources of the network respectively.

The physical behavior of the circuit elements is described by the branch constitutive (BCR) relations:

$$i_g = g v_g \qquad \text{Eq. 4}$$

-continued $$i_c = c \frac{\partial}{\partial t} v_c$$

$$v_l = l \frac{\partial}{\partial t} i_l$$

Where:
g and c are diagonal matrices, whose entries correspond to the conductance and capacitance values of each element. These values are positive for any physical circuit, and consequently, both matrices g and c are symmetric positive definite.

l is the inductance matrix, which is also symmetric positive definite. If mutual inductances are included, then l is a full matrix; otherwise it is a diagonal matrix.

The BCRs for the independent voltage and current sources of the network simply state that $v_v$ and $i_i$ are given functions that can be chosen as inputs to the network, whereas $v_i$ and $i_v$ are unknown output functions that need to be determined as part of the problem of solving the system of equations describing the given RLC network.

A Modified Nodal Analysis (MNA) formulation according to C.-W. HO, A. E. Ruehli, P. A. Brennan, "The Modified Nodal Approach to Network Analysis", IEEE Transactions on Circuits and Systems, Vol. 1X-22, No. 6, June 1975, can be extracted by combining equations 1, 2 and 4, eliminating the current unknowns. MNA equations provide a system representation of an RLCk netlist, as a set of equations that form the time-domain state space representation. For a N-port network, this state space relates the port voltages and currents ($v_v$ and $i_i$) via the state-space vector x, i.e. the node voltages ($v_n$) and the branch currents for voltage sources ($i_v$) and inductors ($i_l$):

$$C\dot{x} + Gx = Bu$$

$$y = B^T x \qquad \text{Eq. 5}$$

The vectors u,y are called input and output vector respectively.

Where $$x = \begin{bmatrix} v_n \\ i_l \\ i_v \end{bmatrix} \quad u = \begin{bmatrix} -i_i \\ v_v \end{bmatrix} \quad y = \begin{bmatrix} v_i \\ i_v \end{bmatrix} \qquad \text{Eq. 6}$$

$$C = \begin{bmatrix} Q & 0 \\ 0 & l \end{bmatrix} \quad G = \begin{bmatrix} N & A_l^T \\ -A_l & 0 \end{bmatrix} \quad B = \begin{bmatrix} A_i \\ 0 \end{bmatrix} \qquad \text{Eq. 7}$$

$$Q = A_c^T c A_c,$$

$$N = A_g^T g A_g$$

Where:
$B \in R^{(N_V + N_l + K) \times K}$,
$A_i \in R^{K \times K}$,
$N \in R^{(N_V + K) \times (N_V + K)}$,
$Q \in R^{(N_V + K) \times (N_V + K)}$,
$l \in R^{N_l \times N_l}$,
$A_l^T \in R^{(N_V + K) \times N_l}$ and Nv is the number of internal nodes, $N_l$ is the number of inductors and K the number of ports.

PRIMA Algorithm

The Passive Reduced-Order Interconnect Macromodeling Algorithm (PRIMA) Odabasioglu, M. Celik, and L. T. Pileggi. "PRIMA: passive reduced-order interconnect macromodeling algorithm". IEEE Trans. on CAD of Integrated Circuits and Systems, 17(8):645-654, 1998, is based on the block Arnoldi algorithm, but employs congruence transformations to project a large system of equations onto a smaller subspace, so that passivity is preserved during reduction. PRIMA uses the Arnoldi iteration as a numerically stable method of generating the Krylov subspace. The transformation matrix matches the first n=(q/K) moments for all k ports, where q is the number of nodes. Since the PRIMA reduced order models are generated via projection onto Krylov subspaces, they satisfy the moment-matching property and are guaranteed to be passive. Given the number of nodes q in the reduced netlist and the number of ports K, n=q/K+1 iterations of the block Arnoldi algorithm are performed to derive the projection matrix V (the extra step is required in case that (q/K) is not an integer).

The PRIMA algorithm is performed as described in Table 1:

TABLE 1

The PRIMA algorithm $R = (G + s_0 C)^{-1} B$,
QR decomposition on $R - (V_0, T) = qr(R)$
$A = -(G + s_0 C)^{-1} C V_0$
for k = 1,2,...,n
  Set $V_k^{(0)} = A V_{k-1}$
  for j = 1,...,k
    $V_k^{(j)} - V_k^{(j-1)} - V_{k-j} V_{k-j}^T V_k^{(j-1)}$
  end
  $V_k = \text{orth}(V_k^{(k)})$
end
set $V = [V_0 V_1 V_2 \ldots V_n]$, In the original deployment of the algorithm, $s_0$ was supposed to be equal to zero. However experimental results indicated that setting $s_0 = 0$ leads usually to a close to singular matrix and instability of numerical calculations. Instead of this, an initial $s_0 = 2\pi f$ is selected by generating a relatively low frequency expansion point, in comparison to the reference bandwidth upper limit and taking care to avoid singularity of the matrix to be inversed.

Structure & I/O Preservation

The matrices G, C and B present certain block structures, which reflect the states of an RCLk circuit. For a given expansion point $s_0$, the reduced-order model generated via projection does not preserve these block structures of the data matrices. In fact, the transformation matrix will be a dense matrix, and then the data matrices of the reduced-order model will also be dense matrices. As a result, synthesizing the system described by the reduced order model, as an actual RLCK electronic circuit, will not be feasible.

A first improvement was performed using the SPRIM approach (R. W. Freund. "Sprim: structure-preserving reduced-order interconnect macromodeling." Computer Aided Design, 2004. ICCAD-2004. IEEE/ACM International Conference on, pages 80-87, November 2004). In contrast to PRIMA, the SPRIM algorithm does not use the matrix V directly for the projection of the original data matrices. Instead, SPRIM utilizes a modified version of the specific matrix:

$$V_{SPRIM} = \begin{bmatrix} V_1 & 0 \\ 0 & V_2 \end{bmatrix} \qquad \text{Eq. 8}$$

Matrices $V_1 \in R^{(N_v+K) \times n}$ and $V_2 \in R^{N_l \times n}$ correspond to the block sizes of G and C respectively. Applying $V_{SPRIM}$ as a projection matrix, a reduced order model is obtained that matches twice as many moments as PRIMA, while the block structure of Eq. 7 is preserved.

Further improvement is introduced by the IOPOR technique (F. Yang, X. Zeng, Y. Su, and D. Zhou, "RLC equivalent circuit synthesis method for structure-preserved reduced order model of interconnects in VLSI", Communication in Computational Physics, 3(2):376-396, 2008) which, in addition to preserving the block structure of the transformation matrices, also preserves the structures of input and output incidence matrices of the system. Starting from the PRIMA projection matrix, the new projection matrix is formed as follows:

$$V_{IOPOR} = \begin{bmatrix} I_{k \times k} & 0 & 0 \\ 0 & V_1 & 0 \\ 0 & 0 & V_2 \end{bmatrix} \quad \text{Eq. 9}$$

Where:
$I_{k \times k}$: Identity Matrix
$V_1$: $N_v \times n$ matrix
$V_2$: $N_l \times n$ matrix If the initial state equations are arranged in such a way that terminal nodes occupy the first k rows of state equation matrices, then the application of the new projection matrix on the initial system preserves both the block structure of equations and the structure of input output incidence matrices. To achieve the final reduced circuit, state equations are reformulated in a second-order form in the frequency-domain. By eliminating in Eq. 6, we obtain the second order system:

$$\left(sQ + N + \frac{F}{s}\right)x = A_i u \quad \text{Eq. 10}$$

where all the system matrices Q, N and F are symmetric and positive semi-definite, $F = A_l^T l^{-1} A_l$ is the susceptance matrix, and $$A_i = \begin{pmatrix} I_{K \times K} \\ 0_{N_v \times K} \end{pmatrix}.$$

Setting $$W = \begin{pmatrix} I_{k \times k} & 0 \\ 0 & V_1 \end{pmatrix}$$

in Eq. 9, we obtain the transformed second order system as:

$$\left(s\tilde{Q} + \tilde{N} + \frac{\tilde{F}}{s}\right)\tilde{x} = \tilde{A}_i u$$

Where:

$\tilde{Q} = W^T Q W, \tilde{N} = W^T N W, \tilde{A}_i = W^T A_i$ $\tilde{l} = V_2^T l V_2, \tilde{A}_l = W^T A_l V_2, \tilde{F} = \tilde{A}_l^T \tilde{l}^{-1} \tilde{A}_l \quad \text{Eq. 11}$ The second-order description of the reduced system (Eq.12) can be viewed as the nodal equation of a circuit with q nodes, which describes the Kirchhoff current law, satisfied in each node of the circuit.

$$\left(s\tilde{Q} + \tilde{N} + \frac{\tilde{F}}{s}\right)\tilde{x} = \tilde{A}_i u \quad \text{Eq. 12}$$

As explained above, to efficiently integrate the reduced matrices into a simulation methodology flow, the reduced model must be represented in a netlist suitable to be used from any simulation software (Spice, Spectre, etc.). However, after unstamping, a synthesized netlist may include non-physical elements, such as negative RLC (See Yang, X. Zeng, Y. Su, and D. Zhou, "RLC equivalent circuit synthesis method for structure-preserved reduced order model of interconnects in VLSI", Communication in Computational Physics, 3(2):376-396, 2008)), or a large number of controlled sources (see Neumayer, R., Haslinger, F., Stelzer, A., Weiger, R., "On the synthesis of equivalent-circuit models for multiports characterized by frequency-dependent parameters", IEEE Transactions on Microwave Theory and Techniques, Volume 50, Issue 12, published 2002, Previously presented. 2789-2796). In such a case, the netlist is of limited use since many simulators cannot handle negative value components. Furthermore, the existence of negative elements (for simulators that accept negative values) or controlled sources result in netlists that are not noise compatible.

In Fernandes Villena, J. "Positive realization of reduced RLCM nets", 19th International Conference on VLSI and System-On-Chip (VLSI-SoC), 2011 IEEE/IFIP, a methodology is presented based on a specific manipulation of the reduced matrices, to ensure that all elements in the equivalent RLC netlist are guaranteed to be positive. A side effect is that the matrix which relates the ports to the internal nodes of the reduced netlist is not preserved. As a result, in order to keep the port connectivity with the internal nodes, a set of current and voltage controlled sources are included, increasing the netlist size especially for netlists with large numbers of ports.

There is therefore a need to improve the unstamping procedure, to realize a positive netlist (RLCk) with reduced or no controlled sources.

Overview

As described herein, a circuit analysis method includes obtaining a netlist of a circuit, generating a reduced model from the netlist, using the reduced model to synthesize a positive netlist having no controlled current or voltage sources, unstamping the synthesized positive netlist, and simulating the circuit using the unstamped synthesized positive netlist.

Also as described herein, a circuit analysis system includes a reduced model generator operable to generate a reduced model of a circuit from a netlist of the circuit, a positive netlist synthesizer operable to generate a positive netlist from the reduced model, the positive netlist having no controlled current or voltage sources, and a circuit analyzer for analyzing the circuit based on the positive netlist.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Embodiments of the present invention are described herein in the context of a system and method for circuit analysis. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Santa Clara, Calif., Microsoft® Windows® XP and Windows® 2000, available from Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like.

Figure 1:
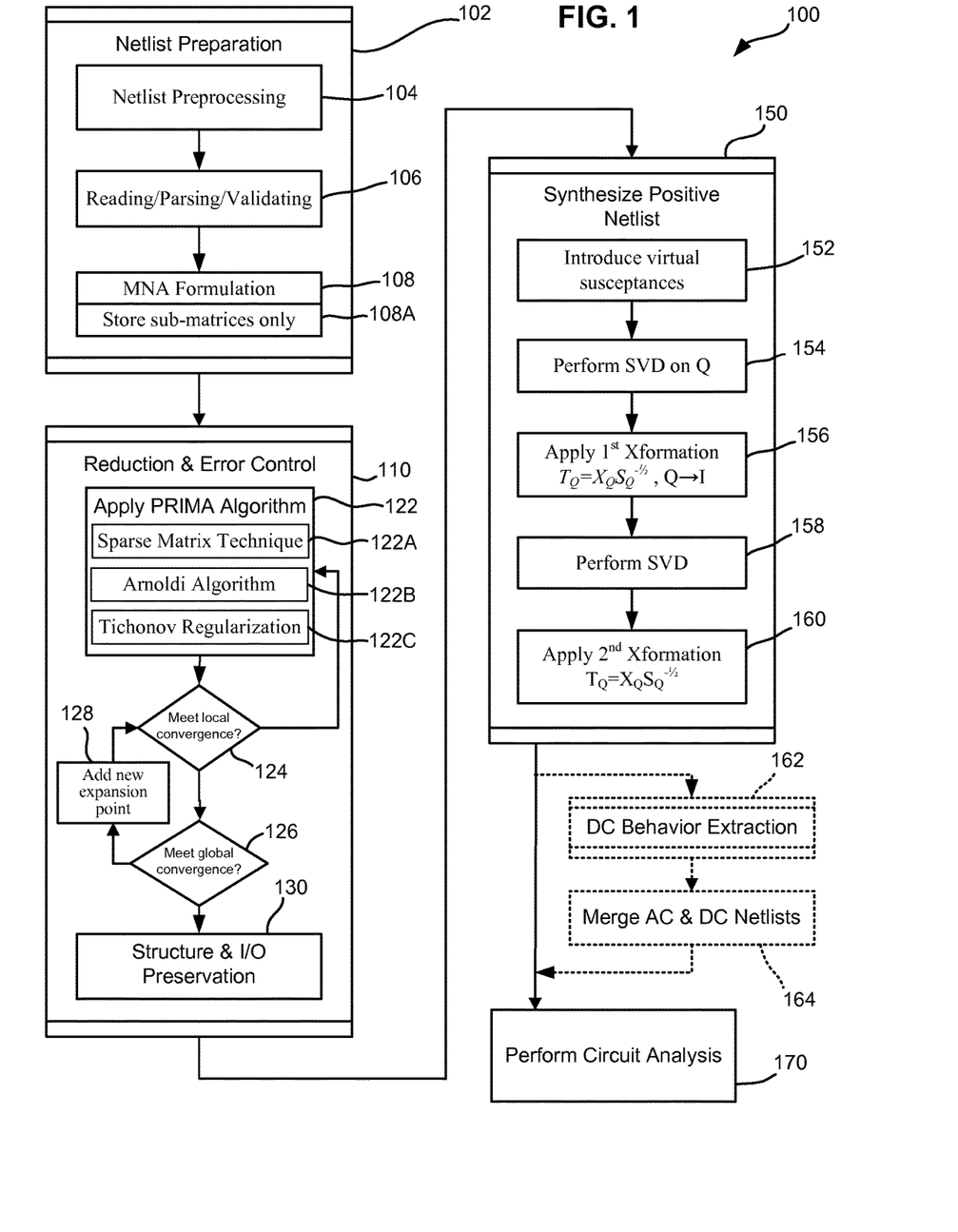
FIG. 1 is a flow diagram for circuit analysis in accordance with certain embodiments.

FIG. 1 is a flow diagram of a circuit analysis method 100 in accordance with certain embodiments. The circuit analysis method 100 begins with a netlist preparation phase 102, followed by a netlist reduction and error control phase 110, a positive netlist synthesis phase 150, and a circuit analysis phase 170.

The netlist preparation phase 102 includes netlist preprocessing at 104, netlist reading/parsing/validating at 106, and creation of a modified nodal analysis (MNA) formulation at 108. As explained above, MNA equations provide a system representation of the RLCk netlist, as a set of equations that form the time-domain state space representation.

It will be appreciated that a "spice file reader" is used to read the RLCk elements and the port names of a netlist, which are stored in a graph-based data structure. Each vertex in the graph corresponds to a node of the input netlist and each edge corresponds to an element (resistance, capacitance, inductance, and mutual inductance). Additional information is stored for each edge that corresponds to its adjacent nodes and its value. After loading the elements of the netlist, the following steps are performed:

Processing of the graph structure in order to:
  Identify and eliminate the ground node
  Correspond the ports to the first indices of the list. In this way, all the ports will be located in the upper left block of the inner states matrix.
Creation of the matrices: $C(Q,l)$, $G(N, A_l)$ and $B(A_l)$.

For very large RLCk netlists (number of elements $>10^9$) the storage and manipulation of the MNA equations matrices becomes a very challenging task due to the restrictions imposed by the available memory. For an RLCk circuit with $N_V$ nodes, K ports and $N_l$ inductors the full matrix size of both G and C matrices is $(N_V+K+N_l)^2$. However, matrices N, Q, B are by construction sparse and only matrix l must be semi-fully stored as a dense diagonal matrix. Consequently, to relax memory requirements, in certain embodiments, only the sub-matrices Q, l, N, $A_l$ are stored, as shown at 108A, instead of the dense matrices C and G. In this manner the memory requirements are reduced, in worst case, by a factor of four $\max\{[(N_v+k)N_l]^2/(N_v+k+N_l)^2\}$.

After Netlist Preparation (102), the next phase, Reduction and Error Control (110), is commenced. The netlist reduction and error control phase 110 includes application of the PRIMA algorithm, at 122.

The main initial step of PRIMA implementation requires the solution of a system of equations:

$$B=(G+s_0C)R \qquad \text{Eq. 13}$$

which may have drawbacks: its large size, its non-sparse form and its non-symmetric shape limit use of time consuming LU decomposition solvers. To address this issue, the block storage of sparse sub-matrices can be exploited in accordance with certain embodiments, as shown at 122A, by formulating Eq. 13 in a block system description as follows:

$$\begin{bmatrix} N + s_0 Q & A_l^T \\ -A_l & s_0 l \end{bmatrix} \begin{bmatrix} R_u \\ R_l \end{bmatrix} = \begin{bmatrix} A_i \\ 0 \end{bmatrix} \quad \text{Eq. 14}$$

$$R = \begin{bmatrix} R_u \\ R_l \end{bmatrix} \quad \text{Eq. 15}$$

wherein:

A 2×2 block system of equations is obtained, which is solved as follows: First, in order to calculate $R_l$, the following equation is derived:

$$R_l = \frac{1}{s_0} l^{-1} A_l R_u \quad \text{Eq. 16}$$

Substituting $R_l$ in Eq. 14 and solving for $R_u$ yields:

$$\left( N + s_0 Q + \frac{A_l^T l^{-1} A_l}{s_0} \right) R_u = A_i \quad \text{Eq. 17}$$

With this step, the symmetric Matrix $l^{-1}$ is transformed into the sparse matrix $A_l^T l^{-1} A_l$. As a result, sparse matrix arithmetic can be employed to solve a sparse matrix linear system with semi-definite positive matrices (Sparse-Cholesky solver).

The benefits from the specific approach are:
- A more efficient memory manipulation, by de-allocating dense matrices.
- Increase in performance, by adopting a fast-Sparse-Cholesky (SC) decomposition instead of using the general LU decomposition algorithm for solving the aforementioned linear system. The SC decomposition increases the speed of computations by a factor greater than two (as for dense matrices the benefit when applying Cholesky decomposition complexity decreases from 2n3/3 to n3/3).

Due to algorithmic arithmetic inaccuracies, the projection matrix V may be ill-conditioned and any transformation with the specific matrix may yield ill-conditioned projected matrices and, by consequence, an ill-conditioned reduced matrix pencil. To overcome this, Tichonov regularization is applied at 122C, which improves the conditioning of the projection matrix, thus enabling an accurate numerical solution for the reduced system.

Having defined the R matrix, the PRIMA algorithm is performed based on projection matrix V generated from the block Arnoldi algorithm (122B in FIG. 1):

The initial variable x is changed according to the congruence transformation:

$$x = V\tilde{x} \quad \text{Eq. 18}$$

$$(V^T C V)\dot{\tilde{x}} + (V^T G V)\tilde{x} = (V^T B)u \quad \text{Eq. 19}$$

$$y = (B^T V)\tilde{x} \quad \text{Eq. 20}$$

In the reduced description of the system the reduced order matrices are:

$$\tilde{C} = V^T C V, \ \tilde{G} = V^T G V, \ \tilde{B} = V^T B \quad \text{Eq. 21}$$

Following the PRIMA application, the flow proceeds to 124. Briefly, it is determined if a local convergence threshold is met. If it is not met, then the iteration is repeated until a local convergence threshold is met. Then at 126, it is determined if a global convergence threshold is also met. If it is not met, then a new expansion point is added, at 128, and the iteration is repeated until the global convergence threshold is met or at most three expansion points are processed.

An efficient error estimation and control methodology must be able to intelligently select the expansion points, based on specific accuracy requirements. A major drawback of all Krylov-based model order reduction techniques is the difficulty to define a global error boundary to be used as convergence criterion. Some attempts have been reported in literature to provide an absolute estimation of an error boundary (see Altan Odabasioglu et al., "Practical considerations for passive reduction of RLC circuits", Proceedings of the 1999 IEEE/ACM international conference on computer-aided design (ICCAD), Previously presented. 214-220), but they are usually overestimating this error, leading to larger netlists than necessary and having augmented computational complexity in comparison to the core computations complexity method.

In certain embodiments, the error estimation, for each iteration of the PRIMA algorithm, is performed using the following relation:

$$\max_{i=1 \ldots N} \left( \frac{\|\tilde{Z}_q(s_i) - \tilde{Z}_{q-1}(s_i)\|}{\|\tilde{Z}_q(s_i)\|} \right)$$

Where $\tilde{Z}_q(S_i)$ is the Z function of the reduced system for the q iteration, calculated at frequency $s_i$, and N is the number of frequency sample points. For improved accuracy, $s_i$ is represented as an imaginary number.

To define whether an additional expansion point is needed and provide an estimation of the convergence achieved, the following methodology is employed:
a) First, the error is evaluated for frequency points in the neighbor of the expansion point. If f is the frequency of a give expansion point, the checking points in certain embodiments are located at 0.85*f, 0.95*f, 1.05*f, 1.15*f. In this way, an estimation of the local convergence is performed, for a given expansion point.
b) Second, the global convergence is estimated, evaluating the error at 15 points in certain embodiments, uniformly distributed across all bandwidths of interest.
c) Based on the local and global estimations, and with reference again to steps 122-126 in FIG. 1, the following decisions are made:
  a. If the local and global convergence is not reached (the error is less than a given threshold value), the algorithm proceeds to the next iteration (adding more moments) within the cycle of the same expansion point.
  b. If local convergence is achieved without global convergence the method proceeds by selecting another expansion point (step 128).
  c. In certain embodiments, the choice of the expansion points is made as follows: The first expansion point is fixed at 0.1 GHz, while the second point is introduced at the end of the frequency band. A third frequency point is added, if needed, in the frequencies having the largest error value.

d. If global convergence is achieved the method ends and the flow proceeds to a structure and I/O preservation procedure 130.

It will be recalled that conventionally, structure and I/O preservation involves the application of SPRIM and IOPOR techniques to respectively preserve the block structure of the transformation matrices and the input and output incidence matrices of the system.

Following the structure and I/O preservation procedure 130, positive netlist synthesis phase 150 commences. A starting point for the positive netlist synthesis 150 is the second order description.

The reduced system extracted from the reduction flow, can be represented as a second-order formulation described in eq. 22.

$$\left(s\tilde{Q} + \tilde{N} + \frac{\tilde{F}}{s}\right)\tilde{x} = A_i u \qquad \text{Eq. 22}$$

Where:

$$A_i = \begin{pmatrix} I_{K \times K} \\ 0_{(q-K) \times K} \end{pmatrix} \qquad \text{Eq. 23}$$

and
$\tilde{Q}$: Reduced capacitance matrix
$\tilde{N}$: Reduced resistor matrix
$\tilde{F}$: Reduced susceptance (inverse of inductance) matrix
$\tilde{x}$: Reduced state-space vector including the node voltages and the branch currents for inductors
u: Input vector including the voltage sources applied in the ports
s: Laplace frequency notation
K: Number of ports
q: Number of nodes in the reduced netlist This second order description can be viewed as the nodal equation of a circuit with q nodes, which describes the Kirchoff current law, satisfied at each node of the circuit.

At 152, k (number of terminals) virtual susceptances are introduced into the reduced $\tilde{F}$ matrix of the second order system of Eq. 1, placed among the preserved reduced terminal nodes and equally numbered new terminal nodes. Consequently, the reduced matrices $\tilde{Q}$ and $\tilde{N}$ are padded with zero sub-matrices, while the $\tilde{F}$ matrix is modified by adding the stamps of the newly-introduced susceptances in the appropriate positions in the matrix. The virtual susceptances have a high value, not affecting the response at the frequency of interest. The matrices are then formulated according to Eq. 24.

$$\left(s\begin{pmatrix} 0_{k \times k} & 0_{k \times q} \\ 0_{q \times k} & \tilde{Q} \end{pmatrix} + \begin{pmatrix} 0_{k \times k} & 0_{k \times q} \\ 0_{q \times k} & \tilde{N} \end{pmatrix} + \frac{1}{s}\begin{pmatrix} F_1 & F_2 \\ F_2^T & \tilde{F} \end{pmatrix}\right)\tilde{x} = \begin{pmatrix} I_{K \times K} \\ 0_{q \times K} \end{pmatrix} u \qquad \text{Eq. 24}$$

Since $\tilde{Q}$ and $\tilde{N}$ may be semi-definite positive matrices, we apply at 153 a positive definite enforcement (PDE) procedure. In this way, the very small eigenvalues below a specific threshold value are set equal to that value and then the matrices are reconstructed based on the eigenvectors and the new eigenvalues. Consequently $\tilde{Q}$ and $\tilde{N}$ become symmetric and positive definite matrices At 154, a singular value decomposition (SVD) is performed on matrix $\tilde{Q}$:

$$\tilde{Q} = X_Q S_Q X_Q^T \qquad \text{Eq. 25}$$

which results in:

$$\left(s\begin{pmatrix} 0 & 0 \\ 0 & X_Q S_Q X_Q^T \end{pmatrix} + \begin{pmatrix} 0 & 0 \\ 0 & \tilde{N} \end{pmatrix} + \frac{1}{s}\begin{pmatrix} F_1 & F_2 \\ F_2^T & \tilde{F} \end{pmatrix}\right)\tilde{x} = \begin{pmatrix} I \\ 0 \end{pmatrix} u \qquad \text{Eq. 26}$$

Considering the following matrix:

$$T_Q = X_Q S_Q^{-1/2} \qquad \text{Eq. 27}$$

At 156 a first transformation is applied as follows:

$$\left(\begin{pmatrix} I & 0 \\ 0 & T_Q^T \end{pmatrix}\left(s\begin{pmatrix} 0 & 0 \\ 0 & X_Q S_Q X_Q^T \end{pmatrix} + \begin{pmatrix} 0 & 0 \\ 0 & \tilde{N} \end{pmatrix} + \frac{1}{s}\begin{pmatrix} F_1 & F_2 \\ F_2^T & \tilde{F} \end{pmatrix}\right)\begin{pmatrix} I & 0 \\ 0 & T_Q \end{pmatrix}\right) \qquad \text{Eq. 26}$$

$$\tilde{x} = \begin{pmatrix} I & 0 \\ 0 & T_Q \end{pmatrix}\begin{pmatrix} I \\ 0 \end{pmatrix} u$$

Since $\tilde{Q}$ is symmetric and positive definite matrix, $X_Q^{-1} = X_Q^T$ which results in the transformation of the $\tilde{Q}$ matrix to the identity matrix I:

$$\left(s\begin{pmatrix} 0 & 0 \\ 0 & I \end{pmatrix} + \begin{pmatrix} 0 & 0 \\ 0 & T_Q^T \tilde{N} T_Q \end{pmatrix} + \frac{1}{s}\begin{pmatrix} F_1 & F_2 T_Q \\ T_Q^T F_2^T & T_Q^T \tilde{F} T_Q \end{pmatrix}\right)\tilde{x} = \begin{pmatrix} I \\ 0 \end{pmatrix} u \qquad \text{Eq. 28}$$

Next at 158, a Singular Value Decomposition to the following case is performed:

$$T_Q^T \tilde{N} T_Q = X_N S_N X_N^T \qquad \text{Eq. 29}$$

and the system is described as follows:

$$\left(s\begin{pmatrix} 0 & 0 \\ 0 & I \end{pmatrix} + \begin{pmatrix} 0 & 0 \\ 0 & X_N S_N X_N^T \end{pmatrix} + \frac{1}{s}\begin{pmatrix} F_1 & F_2 T_Q \\ T_Q^T F_2^T & T_Q^T \tilde{F} T_Q \end{pmatrix}\right)\tilde{x} = \begin{pmatrix} I \\ 0 \end{pmatrix} u \qquad \text{Eq. 30}$$

At 160, the next transformation is then performed as follows:

$$\left(\begin{pmatrix} I & 0 \\ 0 & X_N^T \end{pmatrix}\left(s\begin{pmatrix} 0 & 0 \\ 0 & 1 \end{pmatrix} + \begin{pmatrix} 0 & 0 \\ 0 & X_N S_N X_N^T \end{pmatrix} + \frac{1}{s}\begin{pmatrix} F_1 & F_2 T_Q \\ T_Q^T F_2^T & T_Q^T \tilde{F} T_Q \end{pmatrix}\right)\right. \qquad \text{Eq. 31}$$

$$\left.\begin{pmatrix} I & 0 \\ 0 & X_N \end{pmatrix}\right)\tilde{x} = \begin{pmatrix} I & 0 \\ 0 & X_N^T \end{pmatrix}\begin{pmatrix} I \\ 0 \end{pmatrix} u$$

to obtain the system:

$$\left(s\begin{pmatrix} 0 & 0 \\ 0 & I \end{pmatrix} + \begin{pmatrix} 0 & 0 \\ 0 & S_N \end{pmatrix} + \frac{1}{s}\begin{pmatrix} F_1 & F_2 T_Q X_N \\ X_N^T T_Q^T F_2^T & X_N^T T_Q^T \tilde{F} T_Q X_N \end{pmatrix}\right) = \tilde{x}\begin{pmatrix} I \\ 0 \end{pmatrix} u \qquad \text{Eq. 32}$$

Considering the following matrices:

$$F'_2 = F_2 T_Q X_N \qquad \text{Eq. 33}$$

$$F_3 = X_N^T T_Q^T \tilde{F} T_Q X_N \qquad \text{Eq. 34}$$

the system is equivalently described by:

$$\left(s\begin{pmatrix} 0 & 0 \\ 0 & I \end{pmatrix} + \begin{pmatrix} 0 & 0 \\ 0 & S_N \end{pmatrix} + \frac{1}{s}\begin{pmatrix} F_1 & F'_2 \\ F'^T_2 & F_3 \end{pmatrix}\right) = \tilde{x}\begin{pmatrix} I \\ 0 \end{pmatrix} u \qquad \text{Eq. 35}$$

Figure 2:
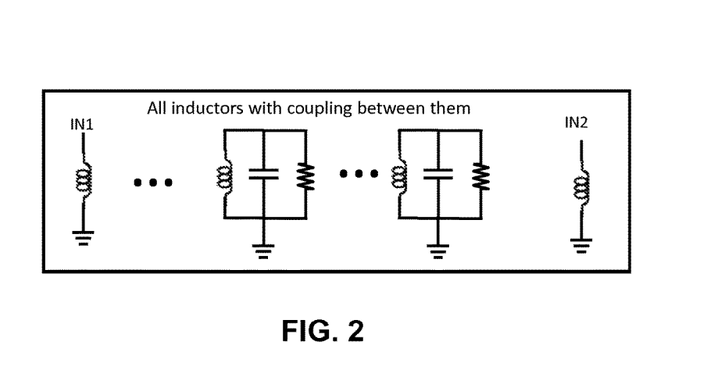
FIG. 2 is a schematic of a synthesized AC circuit for a two port network in accordance with certain embodiments.

In the specific description of Eq. 35, the identity matrix I and the positive valued diagonal matrix $S_N$ correspond respectively to the reduced capacitor $\tilde{Q}$, and resistor $\tilde{N}$ matrices from Eq. 22 and can be directly unstamped by constant value capacitors to Gnd, properly selected without deteriorating rank of successive calculations and positive resistors. The susceptance matrix $$\tilde{F} = \begin{pmatrix} F_1 & F'_2 \\ F'^T_2 & F_3 \end{pmatrix}$$

can be inverted and unstamped using inductors and mutual inductance (k) elements. Since the susceptance matrix is semi-positive definite we apply the PDE procedure at 161, to enforce positive definiteness. As a result the inverse inductance matrix is positive definite and its diagonal elements are all positive and can be realized with positive inductances to the ground. The other, non-diagonal, elements are synthesized as k-elements between each pair of indices of non-diagonal elements. The final synthesized AC circuit for a two port network is presented in FIG. 2. Such a synthesized circuit is then presented for analysis at 170.

One of the main advantages of the described embodiments is that during the described matrix transformations, the incidence matrix $A_i$ remains unchanged. Due to the identity matrix in the upper part of $A_i$, no controlled sources are required and the ports (IN1, IN2) are directly connected to Gnd through inductors as in FIG. 2. Any transformation of the incidence matrix $A_i$, would require the insertion of controlled sources to realize the port-to-nodes connections, and is avoided by the present methodology.

Due to the connection of each port to Gnd through an inductor, all ports appear to be short-circuited to Gnd at DC. Consequently, the AC model can fail to operate at DC.

Figure 3:
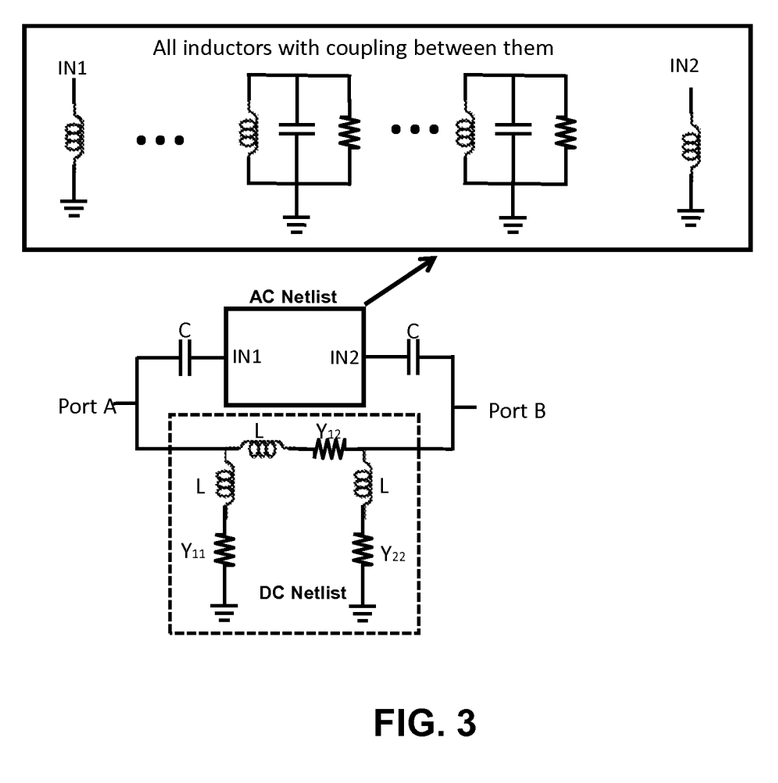
FIG. 3 is a schematic representing composition of a full netlist for a two-port network in accordance with certain embodiments.

To improve DC accuracy, a DC behavior extraction 162 can be conducted, as detailed below with reference to FIG. 4. Once the DC behavior is extracted, the full netlist can be composed by merging the two netlists in a parallel configuration, at 164, and as shown schematically in FIG. 3 for a two-port network. In particular, in FIG. 3, the AC netlist is DC-decoupled from the ports 1 and 2 through the insertion of the capacitors C, while the DC netlist is AC-decoupled from the ports 1 and 2 using the inductors L. Both the decoupling C and L elements must have a high value, not to affect the response at the frequency of interest.

Figure 4:
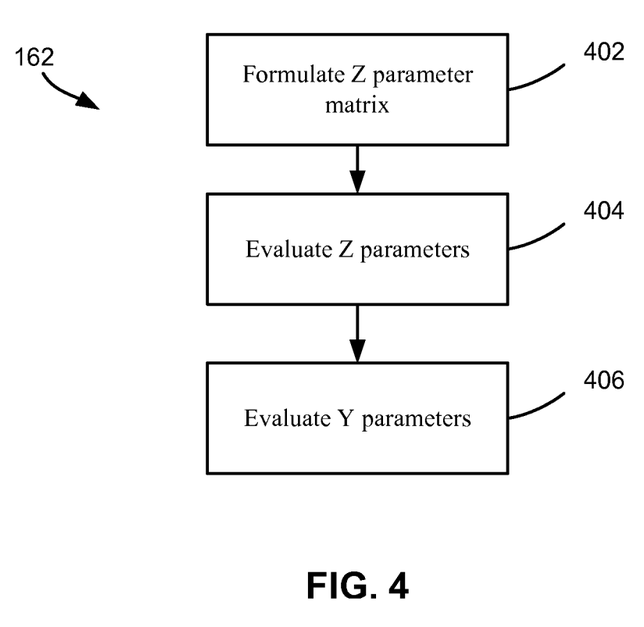
FIG. 4 is a flow diagram showing DC behavior extraction in accordance with certain embodiments.

Turning to FIG. 4, the DC behavior extraction 162 begins by formulating, at 402, the Z parameter matrix of the reduced positive netlist as given in the following equation, $$Z = \begin{pmatrix} A_i \\ 0 \end{pmatrix}^T \left( \begin{pmatrix} \tilde{N} & \tilde{E}_l \\ -\tilde{E}_l^T & 0 \end{pmatrix} + s\begin{pmatrix} \tilde{Q} & 0 \\ 0 & \tilde{F} \end{pmatrix} \right)^{-1} \begin{pmatrix} A_i \\ 0 \end{pmatrix} \qquad \text{Eq. 36}$$

At Step 404 in the extraction 162, the Z matrix of the circuit is calculated at DC. Then, at 406, the Y matrix (Y=Z$^{-1}$) is evaluated, which is unstamped as follows:

A resistor $R_{ij}=-1/Y_{ij}$ is inserted between ports i, j

A resistor $R_i=1/(\Sigma_{j=1}^m Y_{ij})$ is inserted between port i and gnd.

In this manner, the DC behavior of the netlist is extracted.

Figure 5:
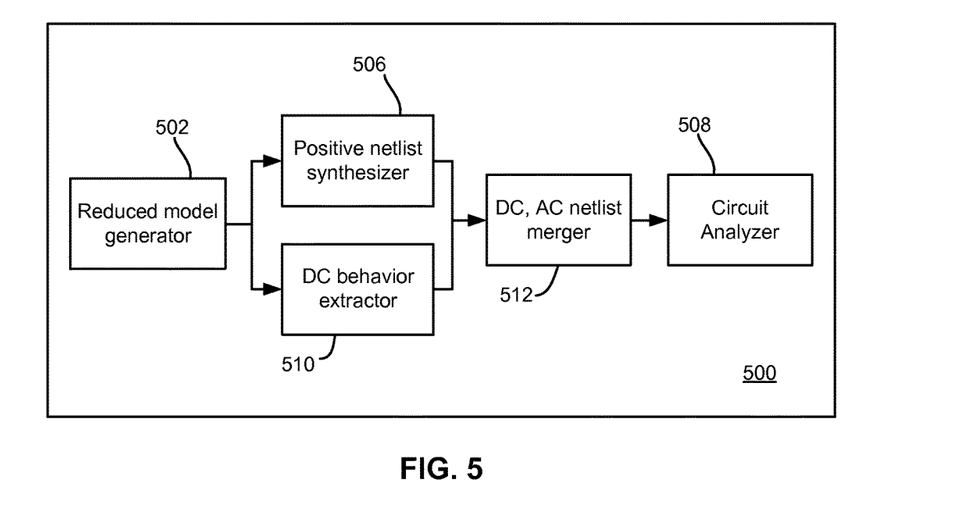
FIG. 5 is a block diagram of a system 500 for implementing circuit analysis using a positive netlist in accordance with certain embodiments.

FIG. 5 is a block diagram of a system 500 for implementing circuit analysis using a positive netlist in accordance with certain embodiments. A reduced model generator 502 receives circuit information as input and generates a reduced model of the circuit. The circuit information from the reduced model generator can be in any computer-readable form, such as floppy or optical disk, data file, server, or the like. The reduced model is provided to a synthesizer 506 for producing a positive AC netlist. A circuit analyzer 508 then operates on the reduced netlist to determine the behavior of the circuit under specific analysis and aid in its design. Different kinds of analysis can be performed by the circuit analyzer 508, such as transient, frequency, s-parameter, noise, periodic steady-state, harmonic balance, and so on.

With continued reference to FIG. 5, the DC behavior extraction is performed in certain embodiments by an extractor 510. The merging of the DC and AC netlists is performed by merger 512.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A circuit analysis method comprising:
   obtaining a netlist of a circuit;
   generating a reduced model from the netlist;
   using a processor to synthesize from the reduced model a positive netlist having no controlled current or voltage sources; and
   unstamping the synthesized positive netlist,
   wherein generating a reduced model from the netlist includes performing Tichonov regularization.

2. The method of claim 1, wherein the reduced model is representable as a second-order formulation given as $$\left(s\tilde{Q} + \tilde{N} + \frac{\tilde{F}}{s}\right)\tilde{x} = A_i u$$

where $$A_i = \begin{pmatrix} I_{K \times K} \\ 0_{(q-K) \times K} \end{pmatrix}$$

$\tilde{Q}$: Reduced capacitance matrix
$\tilde{N}$: Reduced resistor matrix
$\tilde{F}$: Reduced susceptance (inverse of inductance) matrix
$\tilde{x}$: Reduced state-space vector including the node voltages and the branch currents for inductors
u: Input vector including the voltage sources applied in the ports
s: Laplace frequency notation
K: Number of ports
q: Number of nodes in the reduced netlist
and wherein using the reduced model to synthesize a positive netlist comprises:
introducing into the second-order formulation k virtual susceptances, where k is a number of circuit terminals, to achieve the formulation $$\left(s\begin{pmatrix} 0_{k \times k} & 0_{k \times q} \\ 0_{q \times k} & \tilde{Q} \end{pmatrix} + \begin{pmatrix} 0_{k \times k} & 0_{k \times q} \\ 0_{q \times k} & \tilde{N} \end{pmatrix} + \frac{1}{s}\begin{pmatrix} F_1 & F_2 \\ F_2^T & \tilde{F} \end{pmatrix}\right)\tilde{x} = \begin{pmatrix} I_{K \times K} \\ 0_{q \times K} \end{pmatrix} u$$

applying positive definite enforcement (PDE)
performing a first singular value decomposition on the matrix $\tilde{Q}$, represented as $\tilde{Q}=X_Q S_Q X_Q^T$, to achieve $$\left(s\begin{pmatrix}0 & 0 \\ 0 & X_Q S_Q X_Q^T\end{pmatrix}+\begin{pmatrix}0 & 0 \\ 0 & \tilde{N}\end{pmatrix}+\frac{1}{s}\begin{pmatrix}F_1 & F_2 \\ F_2^T & \tilde{F}\end{pmatrix}\right)\tilde{x}=\begin{pmatrix}I \\ 0\end{pmatrix}u$$

considering the matrix $T_Q=X_Q S_Q^{-1/2}$, applying a first transformation $$\left(\begin{pmatrix}I & 0 \\ 0 & T_Q^T\end{pmatrix}\left(s\begin{pmatrix}0 & 0 \\ 0 & X_Q S_Q X_Q^T\end{pmatrix}+\begin{pmatrix}0 & 0 \\ 0 & \tilde{N}\end{pmatrix}+\frac{1}{s}\begin{pmatrix}F_1 & F_2 \\ F_2^T & \tilde{F}\end{pmatrix}\right)\begin{pmatrix}I & 0 \\ 0 & T_Q\end{pmatrix}\right)\tilde{x} =$$
$$\begin{pmatrix}I & 0 \\ 0 & T_Q\end{pmatrix}\begin{pmatrix}I \\ 0\end{pmatrix}u$$

to achieve to the identity matrix I $$\left(s\begin{pmatrix}0 & 0 \\ 0 & 1\end{pmatrix}+\begin{pmatrix}0 & 0 \\ 0 & T_Q^T \tilde{N} T_Q\end{pmatrix}+\frac{1}{s}\begin{pmatrix}F_1 & F_2 T_Q \\ T_Q^T F_2^T & T_Q^T \tilde{F} T_Q\end{pmatrix}\right)\tilde{x}=\begin{pmatrix}I \\ 0\end{pmatrix}u$$

performing a second singular value decomposition to $T_Q^T \tilde{N} T_Q = X_N S_N X_N^T$ to achieve $$\left(s\begin{pmatrix}0 & 0 \\ 0 & 1\end{pmatrix}+\begin{pmatrix}0 & 0 \\ 0 & X_N S_N X_N^T\end{pmatrix}+\frac{1}{s}\begin{pmatrix}F_1 & F_2 T_Q \\ T_Q^T F_2^T & T_Q^T \tilde{F} T_Q\end{pmatrix}\right)\tilde{x}=\begin{pmatrix}I \\ 0\end{pmatrix}u$$

applying a second transformation, $$\left(\begin{pmatrix}I & 0 \\ 0 & X_N^T\end{pmatrix}\left(s\begin{pmatrix}0 & 0 \\ 0 & I\end{pmatrix}+\begin{pmatrix}0 & 0 \\ 0 & X_N S_N X_N^T\end{pmatrix}+\frac{1}{s}\begin{pmatrix}F_1 & F_2 T_Q \\ T_Q^T F_2^T & T_Q^T \tilde{F} T_Q\end{pmatrix}\right)\begin{pmatrix}I & 0 \\ 0 & X_N\end{pmatrix}\right)$$
$$\tilde{x}=\begin{pmatrix}I & 0 \\ 0 & X_N^T\end{pmatrix}\begin{pmatrix}I \\ 0\end{pmatrix}u$$

to obtain $$\left(s\begin{pmatrix}0 & 0 \\ 0 & I\end{pmatrix}+\begin{pmatrix}0 & 0 \\ 0 & S_N\end{pmatrix}+\frac{1}{s}\begin{pmatrix}F_1 & F_2 T_Q X_N \\ X_N^T T_Q^T F_2^T & X_N^T T_Q^T \tilde{F} T_Q X_N\end{pmatrix}\right)\tilde{x}=\begin{pmatrix}I \\ 0\end{pmatrix}u$$

considering the following matrices $F'_2 = F_2 T_Q X_N$ $F_3 = X_N^T T_Q^T \tilde{F} T_Q X_N$ representing the circuit as $$\left(s\begin{pmatrix}0 & 0 \\ 0 & I\end{pmatrix}+\begin{pmatrix}0 & 0 \\ 0 & S_N\end{pmatrix}+\frac{1}{s}\begin{pmatrix}F_1 & F'_2 \\ F_2^{'T} & F_3\end{pmatrix}\right)\tilde{x}=\begin{pmatrix}I \\ 0\end{pmatrix}u$$

3. The method of claim 2, wherein the identity matrix I and the positive valued diagonal matrix $S_N$ correspond respectively to the reduced capacitor $\tilde{Q}$ and resistor $\tilde{N}$ matrices, and wherein the unstamping is a direct unstamping of the identity matrix I and the positive valued diagonal matrix $S_N$ by constant value capacitors to Gnd and positive resistors respectively.

4. The method of claim 2, further comprising inverting and unstamping susceptance matrix $$\tilde{F}=\begin{pmatrix}F_1 & F'_2 \\ F_2^{'T} & F_3\end{pmatrix}$$

using inductors and mutual inductance (k) elements.

5. The method of claim 4, wherein the susceptance matrix $$\tilde{F}=\begin{pmatrix}F_1 & F'_2 \\ F_2^{'T} & F_3\end{pmatrix}$$

is enforced to positive definite, the inverse inductance matrix is positive definite, diagonal elements of the inverse inductance matrix are positive and are synthesized with positive inductances to ground, and non-diagonal elements of the inverse inductance matrix are synthesized as k-elements between each pair of indices of non-diagonal elements.

6. The method of claim 1, further comprising:
generating a DC behavior extraction model, and
merging the DC behavior extraction model with the synthesized a positive netlist.

7. The method of 6, wherein the generating the DC behavior extraction model includes:
formulating a Z parameter matrix of the reduced positive netlist, given by $$Z=\begin{pmatrix}A_i \\ 0\end{pmatrix}^T\left(\begin{pmatrix}\tilde{N} & \tilde{E}_l \\ -\tilde{E}_l^T & 0\end{pmatrix}+s\begin{pmatrix}\tilde{Q} & 0 \\ 0 & \tilde{F}\end{pmatrix}\right)^{-1}\begin{pmatrix}A_i \\ 0\end{pmatrix}$$

calculating the Z matrix at DC,
evaluating the Y matrix, with $Y=Z^{-1}$.

8. The method of claim 7, further comprising unstamping the Y matrix as follows:
A resistor $R_{ij}=-1/Y_{ij}$ is inserted between ports i, j
A resistor $R_i=1/(\Sigma_{j=1}^m K_{ij})$ is inserted between port i and gnd.

9. The method of claim 1, further comprising performing modified nodal analysis (MNA) using the formulations $C\dot{x}+Gx=Bu$ $y=B^T x$ wherein $$x=\begin{bmatrix}v_n \\ i_l \\ i_v\end{bmatrix} u=\begin{bmatrix}-i \\ v_v\end{bmatrix} y=\begin{bmatrix}v_i \\ i_v\end{bmatrix}$$

$$C=\begin{bmatrix}Q & 0 \\ 0 & l\end{bmatrix} G=\begin{bmatrix}N & A_l^T \\ -A_l & 0\end{bmatrix} B=\begin{bmatrix}A_i \\ 0\end{bmatrix}$$

$Q=A_c^T c A_c$,

-continued $$N = A_g^T g A_g$$

Where:

$B \in R^{(N_V+N_l+K) \times K}$, $A_i \in R^{K \times K}$, $N \in R^{(N_V+K) \times (N_V+K)}$, $Q \in R^{(N_V+K) \times (N_V+K)}$, $l \in R^{N_l \times N_l}$, $A_l^T \in R^{(N_V+K) \times N_l}$ and Nv is the number of internal nodes, $N_l$ is the number of inductors and K the number of ports,
and storing only Q, l, N, $A_l$ sub-matrices instead of the dense matrices C and G.

10. The method of claim 1, further comprising simulating the circuit using the unstamped synthesized positive netlist.

11. A circuit analysis system comprising:
a memory;
a processor for executing instructions stored in the memory, the instructions implementing:
a reduced model generator operable to generate a reduced model of a circuit from a netlist of the circuit, wherein generating a reduced model from the netlist includes performing Tichonov regularization; and
a positive netlist synthesizer operable to generate a positive netlist from the reduced model, the positive netlist having no controlled current or voltage sources.

12. The system of claim 11, wherein the reduced model is representable as a second-order formulation given as $$\left(s\tilde{Q} + \tilde{N} + \frac{\tilde{F}}{s}\right)\tilde{x} = A_i u$$

where $$A_i = \begin{pmatrix} I_{K \times K} \\ 0_{(q-K) \times K} \end{pmatrix}$$

and
$\tilde{Q}$: Reduced capacitance matrix
$\tilde{N}$: Reduced resistor matrix
$\tilde{F}$: Reduced susceptance (inverse of inductance) matrix
$\tilde{x}$: Reduced state-space vector including the node voltages and the branch currents for inductors
u: Input vector including the voltage sources applied in the ports
s: Laplace frequency notation
K: Number of ports
q: Number of nodes in the reduced netlist
and wherein the positive netlist synthesizer is further operable to:
introduce into the second-order formulation k virtual susceptances, where k is a number of circuit terminals, to achieve the formulation $$\left(s\begin{pmatrix} 0_{k \times k} & 0_{k \times q} \\ 0_{q \times k} & \tilde{Q} \end{pmatrix} + \begin{pmatrix} 0_{k \times k} & 0_{k \times q} \\ 0_{q \times k} & \tilde{N} \end{pmatrix} + \frac{1}{s}\begin{pmatrix} F_1 & F_2 \\ F_2^T & \tilde{F} \end{pmatrix}\right)\tilde{x} = \begin{pmatrix} I_{K \times K} \\ 0_{q \times K} \end{pmatrix} u$$

apply positive definite enforcement (PDE)
perform a first singular value decomposition on the matrix $\tilde{Q}$, represented as $\tilde{Q} = X_Q S_Q X_Q^T$, to achieve $$\left(s\begin{pmatrix} 0 & 0 \\ 0 & X_Q S_Q X_Q^T \end{pmatrix} + \begin{pmatrix} 0 & 0 \\ 0 & \tilde{N} \end{pmatrix} + \frac{1}{s}\begin{pmatrix} F_1 & F_2 \\ F_2^T & \tilde{F} \end{pmatrix}\right)\tilde{x} = \begin{pmatrix} I \\ 0 \end{pmatrix} u$$

considering the matrix $T_Q = X_Q S_Q^{-1/2}$, applying a first transformation $$\left(\begin{pmatrix} I & 0 \\ 0 & T_Q^T \end{pmatrix}\left(s\begin{pmatrix} 0 & 0 \\ 0 & X_Q S_Q X_Q^T \end{pmatrix} + \begin{pmatrix} 0 & 0 \\ 0 & \tilde{N} \end{pmatrix} + \frac{1}{s}\begin{pmatrix} F_1 & F_2 \\ F_2^T & \tilde{F} \end{pmatrix}\right)\begin{pmatrix} I & 0 \\ 0 & T_Q \end{pmatrix}\right)\tilde{x} = \begin{pmatrix} I & 0 \\ 0 & T_Q^T \end{pmatrix}\begin{pmatrix} I \\ 0 \end{pmatrix} u$$

to achieve to the identity matrix I $$\left(s\begin{pmatrix} 0 & 0 \\ 0 & I \end{pmatrix} + \begin{pmatrix} 0 & 0 \\ 0 & T_Q^T \tilde{N} T_Q \end{pmatrix} + \frac{1}{s}\begin{pmatrix} F_1 & F_2 T_Q \\ T_Q^T F_2^T & T_Q^T \tilde{F} T_Q \end{pmatrix}\right)\tilde{x} = \begin{pmatrix} I \\ 0 \end{pmatrix} u$$

perform a second singular value decomposition to $T_Q^T \tilde{N} T_Q = X_N S_N X_N^T$ to achieve $$\left(s\begin{pmatrix} 0 & 0 \\ 0 & I \end{pmatrix} + \begin{pmatrix} 0 & 0 \\ 0 & X_N S_N X_N^T \end{pmatrix} + \frac{1}{s}\begin{pmatrix} F_1 & F_2 T_Q \\ T_Q^T F_2^T & T_Q^T \tilde{F} T_Q \end{pmatrix}\right)\tilde{x} = \begin{pmatrix} I \\ 0 \end{pmatrix} u$$

apply a second transformation, $$\left(\begin{pmatrix} I & 0 \\ 0 & X_N^T \end{pmatrix}\left(s\begin{pmatrix} 0 & 0 \\ 0 & I \end{pmatrix} + \begin{pmatrix} 0 & 0 \\ 0 & X_N S_N X_N^T \end{pmatrix} + \frac{1}{s}\begin{pmatrix} F_1 & F_2 T_Q \\ T_Q^T F_2^T & T_Q^T \tilde{F} T_Q \end{pmatrix}\right)\begin{pmatrix} I & 0 \\ 0 & X_N \end{pmatrix}\right)\tilde{x} = \begin{pmatrix} I & 0 \\ 0 & X_N^T \end{pmatrix}\begin{pmatrix} I \\ 0 \end{pmatrix} u$$

to obtain $$\left(s\begin{pmatrix} 0 & 0 \\ 0 & I \end{pmatrix} + \begin{pmatrix} 0 & 0 \\ 0 & S_N \end{pmatrix} + \frac{1}{s}\begin{pmatrix} F_1 & F_2 T_Q X_N \\ X_N^T T_Q^T F_2^T & X_N^T T_Q^T \tilde{F} T_Q X_N \end{pmatrix}\right)\tilde{x} = \begin{pmatrix} I \\ 0 \end{pmatrix} u$$

considering the following matrices
$F'_2 = F_2 T_Q X_N$
$F_3 = X_N^T T_Q^T \tilde{F} T_Q X_N$
represent the circuit as $$\left(s\begin{pmatrix} 0 & 0 \\ 0 & I \end{pmatrix} + \begin{pmatrix} 0 & 0 \\ 0 & S_N \end{pmatrix} + \frac{1}{s}\begin{pmatrix} F_1 & F'_2 \\ F'^T_2 & F_3 \end{pmatrix}\right)\tilde{x} = \begin{pmatrix} I \\ 0 \end{pmatrix} u$$

13. The system of claim 12, wherein the identity matrix I and the positive valued diagonal matrix $S_N$ correspond respectively to the reduced capacitor $\tilde{Q}$ and resistor $\tilde{N}$ matrices.

14. The system of claim 11, further comprising:
a DC behavior extractor for generating a model of the DC behavior of the circuit; and
a merger for merging the a positive netlist and the model of the DC behavior.

15. The system of 14, wherein generating the DC behavior extraction model includes:
formulating a Z parameter matrix of the reduced positive netlist, given by $$Z = \begin{pmatrix} A_i \\ 0 \end{pmatrix}^T \left( \begin{pmatrix} \tilde{N} & \tilde{E}_l \\ -\tilde{E}_l^T & 0 \end{pmatrix} + s \begin{pmatrix} \tilde{Q} & 0 \\ 0 & \tilde{F} \end{pmatrix} \right)^{-1} \begin{pmatrix} A_i \\ 0 \end{pmatrix}$$

calculating the Z matrix at DC,
evaluating the Y matrix, with $Y=Z^{-1}$.

16. The system of claim 11, further comprising a circuit analyzer for analyzing the circuit based on the positive netlist.

17. A non-transitory program storage device readable by a machine, embodying a program of instructions executable by the machine to perform a circuit analysis method, the method comprising:
obtaining a netlist of a circuit;
generating a reduced model from the netlist, wherein generating a reduced model from the netlist includes performing Tichonov regularization;
using the reduced model to synthesize a positive netlist having no controlled current or voltage sources; and
unstamping the synthesized positive netlist.

18. The device of claim 17, wherein the reduced model is representable as a second-order formulation given as $$\left( s\tilde{Q} + \tilde{N} + \frac{\tilde{F}}{s} \right)\tilde{x} = A_i u$$

where $$A_i = \begin{pmatrix} I_{K \times K} \\ 0_{(q-K) \times K} \end{pmatrix}$$

and
$\tilde{Q}$: Reduced capacitance matrix
$\tilde{N}$: Reduced resistor matrix
$\tilde{F}$: Reduced susceptance (inverse of inductance) matrix
$\tilde{x}$: Reduced state-space vector including the node voltages and the branch currents for inductors
u: Input vector including the voltage sources applied in the ports
s: Laplace frequency notation
K: Number of ports
q: Number of nodes in the reduced netlist
and wherein using the reduced model to synthesize a positive netlist comprises:
introducing into the second-order formulation k virtual susceptances, where k is a number of circuit terminals, to achieve the formulation $$\left( s \begin{pmatrix} 0_{k \times k} & 0_{k \times q} \\ 0_{q \times k} & \tilde{Q} \end{pmatrix} + \begin{pmatrix} 0_{k \times k} & 0_{k \times q} \\ 0_{q \times k} & \tilde{N} \end{pmatrix} + \frac{1}{s} \begin{pmatrix} F_1 & F_2 \\ F_2^T & \tilde{F} \end{pmatrix} \right) = \tilde{x} \begin{pmatrix} I_{K \times K} \\ 0_{q \times K} \end{pmatrix} u$$

applying positive definite enforcement (PDE)
performing a first singular value decomposition on the matrix $\tilde{Q}$, represented as $\tilde{Q}=X_Q S_Q X_Q^T$, to achieve $$\left( s \begin{pmatrix} 0 & 0 \\ 0 & X_Q S_Q X_Q^T \end{pmatrix} + \begin{pmatrix} 0 & 0 \\ 0 & \tilde{N} \end{pmatrix} + \frac{1}{s} \begin{pmatrix} F_1 & F_2 \\ F_2^T & \tilde{F} \end{pmatrix} \right) \tilde{x} = \begin{pmatrix} I \\ 0 \end{pmatrix} u$$

considering the matrix $T_Q = X_Q S_Q^{-1/2}$, applying a first transformation $$\left( \begin{pmatrix} I & 0 \\ 0 & T_Q^T \end{pmatrix} \left( s \begin{pmatrix} 0 & 0 \\ 0 & X_Q S_Q X_Q^T \end{pmatrix} + \begin{pmatrix} 0 & 0 \\ 0 & \tilde{N} \end{pmatrix} + \frac{1}{s} \begin{pmatrix} F_1 & F_2 \\ F_2^T & \tilde{F} \end{pmatrix} \right) \begin{pmatrix} I & 0 \\ 0 & T_Q \end{pmatrix} \right) \tilde{x} = \begin{pmatrix} I & 0 \\ 0 & T_Q^T \end{pmatrix} \begin{pmatrix} I \\ 0 \end{pmatrix} u$$

to achieve to the identity matrix I $$\left( s \begin{pmatrix} 0 & 0 \\ 0 & I \end{pmatrix} + \begin{pmatrix} 0 & 0 \\ 0 & T_Q^T \tilde{N} T_Q \end{pmatrix} + \frac{1}{s} \begin{pmatrix} F_1 & F_2 T_Q \\ T_Q^T F_2^T & T_Q^T \tilde{F} T_Q \end{pmatrix} \right) \tilde{x} = \begin{pmatrix} I \\ 0 \end{pmatrix} u$$

performing a second singular value decomposition to $T_Q^T \tilde{N} T_Q = X_N S_N X_N^T$ to achieve $$\left( s \begin{pmatrix} 0 & 0 \\ 0 & I \end{pmatrix} + \begin{pmatrix} 0 & 0 \\ 0 & X_N S_N X_N^T \end{pmatrix} + \frac{1}{s} \begin{pmatrix} F_1 & F_2 T_Q \\ T_Q^T F_2^T & T_Q^T \tilde{F} T_Q \end{pmatrix} \right) \tilde{x} = \begin{pmatrix} I \\ 0 \end{pmatrix} u$$

applying a second transformation, $$\left( \begin{pmatrix} I & 0 \\ 0 & X_N^T \end{pmatrix} \left( s \begin{pmatrix} 0 & 0 \\ 0 & I \end{pmatrix} + \begin{pmatrix} 0 & 0 \\ 0 & X_N S_N X_N^T \end{pmatrix} + \frac{1}{s} \begin{pmatrix} F_1 & F_2 T_Q \\ T_Q^T F_2^T & T_Q^T \tilde{F} T_Q \end{pmatrix} \right) \begin{pmatrix} I & 0 \\ 0 & X_N \end{pmatrix} \right)$$
$$\tilde{x} = \begin{pmatrix} I & 0 \\ 0 & X_N^T \end{pmatrix} \begin{pmatrix} I \\ 0 \end{pmatrix} u$$

to obtain $$\left( s \begin{pmatrix} 0 & 0 \\ 0 & I \end{pmatrix} + \begin{pmatrix} 0 & 0 \\ 0 & S_N \end{pmatrix} + \frac{1}{s} \begin{pmatrix} F_1 & F_2 T_Q X_N \\ X_N^T T_Q^T F_2^T & X_N^T T_Q^T \tilde{F} T_Q X_N \end{pmatrix} \right) \tilde{x} = \begin{pmatrix} I \\ 0 \end{pmatrix} u$$

considering the following matrices $$F'_2 = F_2 T_Q X_N$$

$$F_3 = X_N^T T_Q^T \tilde{F} T_Q X_N$$

representing the circuit as $$\left( s \begin{pmatrix} 0 & 0 \\ 0 & I \end{pmatrix} + \begin{pmatrix} 0 & 0 \\ 0 & S_N \end{pmatrix} + \frac{1}{s} \begin{pmatrix} F_1 & F'_2 \\ F_2^{'T} & F_3 \end{pmatrix} \right) \tilde{x} = \begin{pmatrix} I \\ 0 \end{pmatrix} u$$

19. The device of claim 18, wherein the identity matrix I and the positive valued diagonal matrix $S_N$ correspond respectively to the reduced capacitor $\tilde{Q}$ and resistor $\tilde{N}$ matrices, and wherein the unstamping is a direct unstamping of the identity matrix I and the positive valued diagonal matrix $S_N$ by constant value capacitors to Gnd and positive resistors respectively.

20. The device of claim 18, the method further comprising inverting and unstamping susceptance matrix $$\tilde{F} = \begin{pmatrix} F_1 & F_2' \\ F_2'^T & F_3 \end{pmatrix}$$

using inductors and mutial inductance (k) elements.

21. The device of claim 20, wherein the susceptance matrix $$\tilde{F} = \begin{pmatrix} F_1 & F_2' \\ F_2'^T & F_3 \end{pmatrix}$$

is enforced to positive definite, the inverse inductance matrix is positive definite, diagonal elements of the inverse inductance matrix are positive and are synthesized with positive inductances to ground, and non-diagonal elements of the inverse inductance matrix are synthesized as k-elements between each pair of indices of non-diagonal elements.

22. The device of claim 17, the method further comprising:
generating a DC behavior extraction model, and
merging the DC behavior extraction model with the synthesized a positive netlist.

23. The device of claim 22, wherein the generating the DC behavior extraction model includes:
formulating a Z parameter matrix of the reduced positive netlist, given by $$Z = \begin{pmatrix} A_i \\ 0 \end{pmatrix}^T \left( \begin{pmatrix} \tilde{N} & \tilde{E}_l \\ -\tilde{E}_l^T & 0 \end{pmatrix} + s \begin{pmatrix} \tilde{Q} & 0 \\ 0 & \tilde{F} \end{pmatrix} \right)^{-1} \begin{pmatrix} A_i \\ 0 \end{pmatrix}$$

calculating the Z matrix at DC,
evaluating the Y matrix, with $Y = Z^{-1}$.

24. The device of claim 23, the method further comprising unstamping the Y matrix as follows:
A resistor $R_{ij} = -1/Y_{ij}$ is inserted between ports i, j
A resistor $R_i = 1/(\Sigma_{j=1}^m Y_{ij})$ is inserted between port i and gnd.

25. The device of claim 17, the method further comprising performing modified nodal analysis (MNA) using the formulations $$C\dot{x} + Gx = Bu$$
$$y = B^T x$$

wherein $x = \begin{bmatrix} v_n \\ i_l \\ i_v \end{bmatrix}$ $u = \begin{bmatrix} -i_i \\ v_v \end{bmatrix}$ $y = \begin{bmatrix} v_i \\ i_v \end{bmatrix}$ $$C = \begin{bmatrix} Q & 0 \\ 0 & l \end{bmatrix} \quad G = \begin{bmatrix} N & A_l^T \\ -A_l & 0 \end{bmatrix} \quad B = \begin{bmatrix} A_i \\ 0 \end{bmatrix}$$

$$Q = A_c^T c A_c, N = A_g^T g A_g$$

Where: $B \in R^{(N_V + N_l + K) \times K}$, $A_i \in R^{K \times K}$, $N \in R^{(N_V + K) \times (N_V + K)}$, $Q \in R^{(N_V + K) \times (N_V + K)}$, $l \in R^{N_l \times N_l}$, $A_l^T \in R^{(N_V + K) \times N_l}$ and Nv is the number of internal nodes, $N_l$ is the number of inductors and K the number of ports,
and storing only $Q, 1, N, A_l$ sub-matrices instead of the dense matrices C and G.

26. The device of claim 17, the method further comprising simulating the circuit using the unstamped synthesized positive netlist.

* * * * *